(12) United States Patent
Wong et al.

(10) Patent No.: US 6,794,868 B1
(45) Date of Patent: Sep. 21, 2004

(54) METHOD OF SHIM OPTIMIZATION

(75) Inventors: Wai Ha Wong, San Jose, CA (US); Weston A. Anderson, Palo Alto, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/600,292

(22) Filed: Jun. 20, 2003

(51) Int. Cl.$^7$ ............................................... G01V 3/00
(52) U.S. Cl. ...................................... 324/307; 324/309
(58) Field of Search ................................ 324/307, 309, 324/318, 319, 321, 322; 128/653.5

(56) References Cited

U.S. PATENT DOCUMENTS

| | | | | |
|---|---|---|---|---|
| 4,580,098 | A | * | 4/1986 | Gluckstern et al. .......... 324/307 |
| 5,552,709 | A | * | 9/1996 | Anderson .................... 324/321 |
| 6,696,838 | B2 | * | 2/2004 | Raftery et al. ............... 324/321 |

OTHER PUBLICATIONS

Article by Clark, W..G., et al., entitled Multiple Coil Pulsed NMR Method for Measuring the Multipole Moments of Particle Accelerator Bending Magnets, published by J. Appl. Phys., 63 (8), Apr. 15, 1988, pp. 4185–4186.

Book by Press, W.H. et al., entitled "Numerical Recipes in C" published by Cambridge University Press 1988, Chapter 14, pp. 517–523.

Book by Kreyszig, E., entitled Advanced Engineering Mathematics, published by John Wiley and Sons, Inc., 1972, Section 18–11, pp. 681–684.

* cited by examiner

*Primary Examiner*—Btij B. Shrivastav
(74) *Attorney, Agent, or Firm*—Bella Fishman

(57) ABSTRACT

A method of optimizing effects of a shim system on static magnetic field in an imaging system or liquid spectroscopy system, wherein for each cell of a probe disposed within the magnetic field, the resonant frequency is obtained without any current being supplied to any shim coil, then for each cell, the resonant frequency thereof is obtained by a current being supplied to one shim without any current being supplied to the other shims, and a factor is obtained for each cell due only to the magnetic field produced by current supplied to the one shim, and the resulting difference divided by the current supplied to the shim is obtained for each cell for each separate shim current, from the data an equation is derived relating the field at each cell to the individual shim current. For the case when the number of cells is equal to or less than the number of shim coils, this equation is inverted to give the shim current values to produce the same field at all cells. For the case when the number of cells is greater than the number of shim coils, a least square method is applied utilizing the equation and matrix factors to determine the current values which produce the least errors in the cells.

8 Claims, 1 Drawing Sheet

METHOD OF SHIM OPTIMIZATION

BACKGROUND OF THE INVENTION

1. Field of Invention

This invention relates to a method of optimizing the effects of a shim on magnetic field in an imaging apparatus or a multi-sample spectrometer; and more particularly, to such a method for determining values of currents applied to the coils of the shim so as to enable homogeneous magnetic field to be applied to a plurality of cells of a probe used therein.

2. Discussion of the Related Art

In the art, there is provided an imaging system, such as those utilizing nuclear magnetic resonance (NMR), wherein a radio frequency (RF) probe having one or more cells therein is used to obtain data from one or more samples. Each cell has a space for holding a sample, such as a mouse. The plurality of cells are disposed within a space of a magnet, which could be a superconducting magnet, an electro magnet or a permanent magnet, which provides a static magnetic field within which the cells are disposed. The RF signal is provided, for example, by a common RF power source to each cell, through a power divider, which transmits an RF signal to each cell. The resulting imaging signal is received by each cell and is coupled through a transmit/receive (T/R) circuit to a separate receiver, detector and data storage memory, all of which are known in the art. A plurality of probes, each having one or more cells, can also be used.

The static magnetic field, contained within the sample space, usually requires adjustment for desired properties, such as magnetic homogeneity. This can be done by a shim system of one or more coils which are located at different positions with respect to the magnetic field to produce magnetic field gradients used to compensate for spatial variations of the magnetic field.

The shim coils need to be adjusted to produce uniform magnetic field value Bo to all of the probe cells in order to produce optimal results.

One method for shim adjustment is to combine the RF output signals for each cell and couple the combined RF signals to a common receiver. With use of a simulated sample, such as a simulated mouse, in each cell, the plurality of shim coils can be adjusted to obtain overall signal height or narrowest overall line width, as desired. Another method, and similar to the foregoing method, is to combine the signals after detection and use the resulting signal height or line width to determine the optimal shim setting. In order to avoid problems with signal phasing, the absolute signal amplitude can be used instead of a phase adjusted absorption mode response.

In liquid spectroscopy, wherein multiple probe cells are used with multiple shim coils for adjustment of common signals, similar problems exist.

The foregoing shim adjustment methods have all been found to have deficiencies and leave much to be desired. In these cases, adjustment requires repeated optimization steps. Also, adjustment of one shim coil changes the optimization required of other shim coils so that it is difficult to obtain the desired degree of optimization for all of the shim coils without requiring an undue number of readjustment steps to achieve the desired optimization. Also, there is continued uncertainty of whether the best fit or adjustment is ever obtained. Thus, there is, in the art, uncertainty when an adjustment procedure should be terminated.

SUMMARY OF THE INVENTION

Accordingly, an object of the invention is to overcome the aforementioned and other deficiencies and disadvantages of the prior art.

Another object is to optimize the effects of the shim system on magnetic fields to provide uniformity of magnetic field values at different probe cells disposed therein.

A further object is to obtain the same value of resonant frequency of simulated samples at different probe cells disposed in a static magnetic field.

A further object is to provide optimal shim settings in a liquid spectroscopy system utilizing a probe having a plurality of cells.

Another object is to optimize shim settings so that a minimum amount of errors occurs in a magnetic field at different probe cells.

The foregoing and other objects are attained in the invention method which is based on the mathematical relation of the frequency in a cell $F_j$ depends on the linear relationship with currents $I_1, I_2, \ldots I_N$ of the shim coils $1, 2, \ldots N$, with a constant term $G_j$, the frequency being with no currents in the shim coils. This linear relationship is expressed by the following;

$$F_j = G_j + \sum_{k=1}^{N} a_{jk} I_k.$$

One object of the invention is to find the shim current values that will result in the same resonant frequency at each cell.

This is done by first measuring the resonant frequency of the cells when no current is applied to the shim coils giving the values of $G_j$, and then, for each cell j measuring the change of the resonant frequency $(F_j - G_j)$ when a current is applied to one shim coil k without any current being applied to the other shim coils. The change in frequency $(F_j - G_j)$ divided by the current $I_k$ that produced that change gives a sensitivity factor $a_{jk}$ of the one cell of the selected shim coil k. For the selected cell j the process is carried out for the current in each shim coil k. The process is repeated for each cell j giving a matrix of sensitivity factors $a_{jk}$. The shim currents values required to produce the same frequency in each cell are calculated by a matrix multiplication of the inverse of the sensitivity matrix $a_{jk}$ and difference of the target frequency and initial frequency of each cell $F_j - G_j$.

For the case, when the number of RF probe cells M is greater than the number of shim coils N, the matrix of values is operated on to obtain the least square of errors thereby minimizing the difference of the magnetic field values from the desired values $F_j - G_j$.

A feature of the invention is a method of optimizing effects of shims on adjusting a, magnetic field applied to a plurality of cells of a probe, comprising the steps of determining a value of current which is applied to a plurality of shim coils so that the resonant frequency of each cell of the probe is substantially the same and so that the plurality of cells of the probe are subjected to a uniform magnetic field.

Another feature is the method wherein the value of the current is determined using the following steps: measuring resonant frequency of each of the probe cells disposed in the magnetic field without any current being supplied to the plurality of coils of the shim, thereby to obtain $G_1, G_2, \ldots, G_M$, wherein M is the number of the probe cell; measuring resonant frequency of a first cell of the probe using a current $I_1$, applied to a first shim coil and without any current being applied to the other shim coils to obtain $F_{11}$, wherein the first subnumber is the number of the probe cell and the second subnumber is the number of the shim coil which is energized by current $I_1$; measuring resonant frequency of a second cell with current $I_1$ being applied to a first shim coil and without any current being applied to the other shim coils, to obtain $F_{21}$. This process is contained for the remaining cells up through $F_{MI}$. The process is then repeated measuring the frequencies of the cells for a current $I_2$ in shim coil 2, with no other shim currents present. Continuing this process through all shim coils leads to a matrix of values $F_{jk}$. The sensitivity matrix ajk is then found using the following:

$$a_{jk} = \frac{F_{jk} - G_j}{I_k}$$

wherein the matrix becomes;

$$A = \begin{bmatrix} a_{11} & a_{12} & \ldots & a_{1N} \\ a_{21} & a_{22} & \ldots & a_{2N} \\ \vdots & \vdots & & \vdots \\ a_{MI} & a_{M2} & \ldots & a_{MN} \end{bmatrix}$$

The frequencies at each cell j, $F_j$ and current in each shim k, $I_k$ in matrix form are:

$$F = \begin{bmatrix} F_1 \\ F_2 \\ \vdots \\ F_M \end{bmatrix} \quad G = \begin{bmatrix} G_1 \\ G_2 \\ \vdots \\ G_M \end{bmatrix} \quad I = \begin{bmatrix} I_1 \\ I_2 \\ \vdots \\ I_N \end{bmatrix}$$

With these definitions the linear relationship between the frequencies of the cells, F, and the shim currents, I, is expressed in matrix form by the following:

$$F = G + AI$$

One object of the invention is to find the shim current values, which produce the same frequency, or the best approximation to the same frequency, in each cell.

A feature is the method of optimization applied when the number of independent shim coils N is equal to the number of probe cells M, wherein the matrix is square and has a unique inverse $A^{-1}$. To find the shim current values $I_k$, which produce the same frequency in each cell is the following matrix equation is solved by setting all values of $F_j$ equal, i.e. set $F_1 = F_2 = \ldots = FM$:

$$I = A^{-1}(F - G),$$

Wherein $A^{-1}$ is the inverse matrix of A, i.e. $A^{-1} A = 1$.

Another feature is the foregoing method being utilized when the number of shim coils N is equal to or greater than the number of probe cells M.

A further feature is the optimization method when the number of shim coils N is less than the number of probe cells M, and wherein the currents in each shim are calculated according to a least square mathematical operation, and the least error in the magnetic field values are obtained for each cell.

Another feature is wherein the method is used to optimize shims used in adjustment of magnetic fields in an imaging system wherein the magnetic field is supplied by a magnet, and the plurality of probe cells are disposed in the magnetic field and the shims are disposed close to the cells and within the magnetic field.

Another feature is use of the method in a liquid spectroscopy apparatus wherein the probe cells and the shim coils are utilized for a plurality of samples.

BRIEF DESCRIPTION OF THE DRAWINGS

For a better understanding of the present invention, reference is made to the accompanying drawings.

DETAILED DESCRIPTION OF THE PREFERRED EMBODIMENTS

Figure 1:
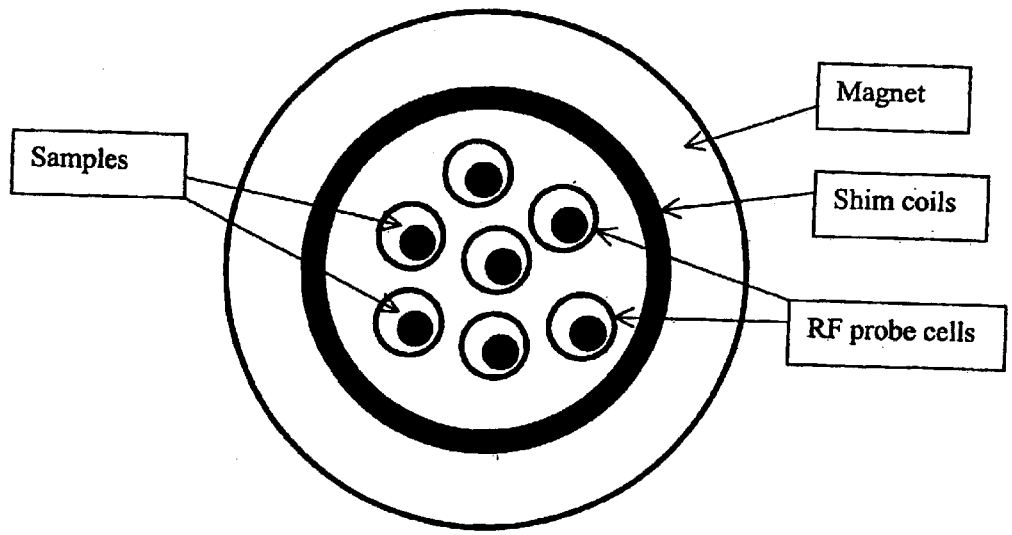
FIG. 1 shows a schematic view of assembly comprising a magnet with shim coils disposed therein, shim coils comprise a plurality of RF probe cells, each having a sample therein.
Figure 2:
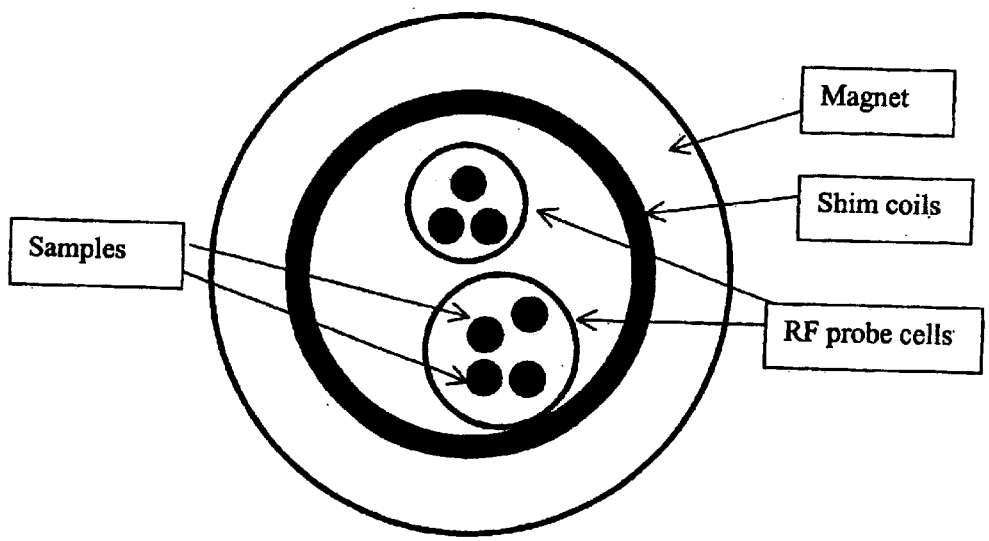
FIG. 2 shows a schematic view of assembly comprising a magnet with shim coils disposed therein. Shim coils have a plurality of RF probe cells, wherein each RF probe cell has a plurality of samples.

This invention is applicable to an imaging system, such as a nuclear magnetic resonance imaging system, wherein one or more probes, each having one or more cells therein, are disposed in a static magnetic field, which may be supplied by a superconductive magnet, an electromagnet, or a permanent magnet. To adjust or account for various inhomogeneities, such as residual magnetism, imperfections in the magnetic coils, etc, of the static magnetic field, one or more shims, each having one or more coils, such as linear and quadratic gradient and higher order shim coils, are utilized within the magnetic field, as known in the art. Further, the shim coils are made to produce magnetic field corrections that are linearly independent, i.e., the corrections produced by anyone of the shim coils cannot be achieved by some combination of currents in the remaining shim coils. As above discussed, there are various methods known in the art, for optimizing the effects of the shim coils on the magnetic field, but, none of which are entirely satisfactory.

The instant invention intends to optimize the setting of the shim currents in a reliable and simple manner.

The invention is also applicable to high resolution liquid spectroscopy systems, wherein a plurality of the cells are utilized concurrently to analyze a plurality of samples.

It was discovered that for a probe having a plurality of cells (each usable for a separate sample, e.g. a mouse or a simulated sample, e.g. a simulated mouse) and disposed in a static magnetic field with a shim system having a plurality of shim coils to adjust the static magnetic field to compensate for various inhomogeneities, the best overall Bo magnetic field homogeneity for all the probe cells is obtained when the same value of magnetic field is obtained at each cell. This was obtained when the resonant frequency of each cell, e.g. with a simulated sample therein, had the same value.

The resonant frequency $F_j$ of a particular probe cell j is equal to the resonant frequency $G_j$ of that probe cell due to the static magnetic field and without any influence due to current being applied to any of the shim coils, plus the sum of the contributions to the resonant frequency made by current applied to the other shim coils, that is:

$$F_j = G_j + \sum_{k=1}^{N} a_{jk} I_k \qquad (1)$$

The following description describes a method of determining shim coil settings that give the best overall measurement to minimize errors in the magnetic field values of the cells.

When using a probe having a plurality of cells M, and a shim system having a plurality of coils N within the magnetic field, a first step in the invention method is to measure the resonant frequency of each cell without any current being applied to any of the shim coils. The result can be called $G_1, G_2, \ldots, G_M$, wherein M is the number of the cell being measured for resonant frequency.

Next, the resonant frequency of each cell $F_j$ is measured with a current $I_1$ being applied to shim coil 1 with no current being applied to the other shim coils. The current $I_1$ can be of any non-zero arbitrary value. The resonant frequency measurement is repeated for each cell j yielding $F_{j1}$. The following equation is attained:

$$a_{jl} = \frac{F_{jl} - G_j}{T_1} \tag{2}$$

Then, the resonant frequency of the first cell is measured (called $F_{12}$) with a current $I_2$ of non-zero arbitrary same value applied to shim coil 2, with no current being applied to the other shim coils. Doing this for all cells produces a factor $a_{j2}$ from the above equation (2), wherein the subscript 1 is replaced by the subscript 2.

The foregoing steps are repeated for each of the probe cells and for each of the shim coils using currents $I_k$ so as to produce a plurality of factors $a_{jk}$, for each row M (equal to number of cells) and each column N (equal to number of coils), which then produces a matrix product A, as below:

$$A = \begin{bmatrix} a_{11} & a_{12} & \ldots & a_{1N} \\ a_{21} & a_{22} & \ldots & a_{2N} \\ \vdots & \vdots & & \vdots \\ a_{M1} & a_{M2} & \ldots & a_{MN} \end{bmatrix} \tag{3}$$

The matrix form for frequencies of the cells $F_j$, the residual frequencies $G_j$, and currents in each shim coil $I_k$ are as set forth below:

$$F = \begin{bmatrix} F_1 \\ F_2 \\ \vdots \\ F_M \end{bmatrix} \quad G = \begin{bmatrix} G_1 \\ G_2 \\ \vdots \\ G_M \end{bmatrix} \quad I = \begin{bmatrix} I_1 \\ I_2 \\ \vdots \\ I_N \end{bmatrix}$$

Equation (1), written in matrix form is:

$$F = G + AI \tag{4}$$

wherein F is the resonant frequency of all cells, G is the resonant frequency of all cells in the static magnetic field without current being applied to the coils, and A is the matrix product of the factors matrix (3) due to influence of current in the shim coils.

When N=M, i.e. the number of shim coils is equal to the number of probe cells, the matrix A is square and has an inverse matrix $A^{-1}$. As mentioned above the shim coils must be linearly independent, with the result that no row of matrix A is a linear combination of other rows. This condition is satisfied if the determinant of A does not vanish. If the determinant of A=0, i.e. $|A|=0$, then the coefficients of $a_{ij}$ are not linearly independent, and the matrix A does not have an inverse. This can happen if two of the shim coils produce identical fields at each cell and therefore are redundant. When the number of non-redundant shim coils are equal to the number of probe cell the matrix A has an inverse. The inverse matrix $A^{-1}$ satisfies the condition $A^{-1}A=U$, wherein U is the unit matrix with unity on the diagonal and 0's elsewhere.

The calculation of the inverse of a matrix is well known in the art and does not form part of this disclosure. Methods of analyzing matrices are found in many books, for example "Matrix Analysis" by Roger A. Horn and Charles R. Johnson. Various software programs such as Mathcad by MathSoft, Inc. Cambridge, Massachusetts are available that numerically invert a matrix and perform other matrix operations.

When the number of shim coils is less than the number of probe cells there is insufficient number of controls to guarantee the same field can be created at each cell. In this case, the least square operation is used to come as close as possible.

The problem is to find the shim currents I required to produce the same field $F_0$ at each cell, i.e $F_1 = F_2, \ldots, = F_M = F_0$. The currents I are then obtained by the following equation:

$$I = A^{-1}(F - G) \tag{5}$$

The current is thus a matrix of currents obtained in equation 5 by using the following frequency matrix:

$$I = \begin{bmatrix} I_1 \\ I_2 \\ \vdots \\ I_M \end{bmatrix} \text{ with } F = \begin{bmatrix} F_0 \\ F_0 \\ \vdots \\ F_0 \end{bmatrix} \tag{6}$$

When N is greater than M, there are more shim coils than are required to produce identical resonant frequencies in each cell. In that case, one can select M shim coils only for use in the shimming of the apparatus. Usually, lower order shim coils values are used. In that case, the foregoing rules for the case of N being equal to M, would also be applicable.

Other different numbers for N coils can be used, and the results suitably utilized. For example, data from all of the coils can be utilized to optimize some other parameters, such as total shim power, or to improve homogeneity of one of the cells. Another procedure is to place more than one sample in some or all of the cells so the number of samples is less than or equal to the number of shim coils. In this case the number of shim coils would be greater than the number of probe cells, but need not be greater than the number of samples.

When N is less than M, the number of shim coils N is insufficient to guarantee that the frequencies of all M probe cells would be of the same value. Thus, it was found that the shim coil settings could be obtained by using the least square of errors of frequencies from the desired frequency $F_0$. That is, a method of least squares is used to obtain a current $I_k$ that best matches the frequency of each cell $F_j$ to desired frequency $F_0$. In such a method, the squares of the errors at each cell are added up to generate an error function, namely:

$$E = \sum_{j=1}^{M} (F_1 - F_0)^2 = \sum_{j=1}^{M} \left( G_j - F_0 + \sum_{k=1}^{N} a_{jk} I_k \right)^2. \tag{7}$$

To find the N current values that minimize E, we set the derivatives $dE/dI_1, dE/dI_2, \ldots, dE/dI_N$ equal to zero. For the case of $dE/dI_p$, this becomes:

$$\frac{dE}{dI_P} = 2\sum_{j=1}^{M}\left(G_j - F_0 + \sum_{k=1}^{N} a_{jk}I_k\right)a_{jp} = 0. \quad (8)$$

The right hand equality can be expressed in the following matrix form:

$$A^T A I = A^T (F-G) \quad (9)$$

Here, $A^T$ is the transposition of matrix A, I is a 1 by N the column matrix, and F–G is a 1 by M column matrix, as follows:

$$F - G = \begin{bmatrix} F_0 - G_1 \\ F_0 - G_2 \\ \vdots \\ F_0 - G_M \end{bmatrix} \quad (10)$$

The values of A and G were determined by measurements described above. $F_0$ is the desired frequency of operation. Since $F_0$ can be selected to be of any desired value, it is assumed that current I applied to one of the shim coils actually controls the main magnetic field, i.e., it applies the same magnetic field to all cells of the probe.

To determine the value of shim currents which provide the best fit, equation (9) must be solved for the shim current I. This is done by matrix multiplication of equation (9) by $(A^T A)^{-1}$. This yields the following equation:

$$I = (A^T A)^{-1} A^T (F-G) \quad (11)$$

It was assumed that N is less than M. In this case, neither A nor $A^T$ is a square; however, $A^T A$ is a square and has an inverse $(A^T A)^{-1}$. If A were square, then an inverse $A^{-1}$ would exist, and equation (11) would be reduced to equation (5), which is the case for when N is equal to M.

Advantageously, with the invention a simple set of measurements provides results which are used to provide a current values which can be applied to the set of shim coils to produce the same resonant frequencies of all the probe cells when N=M and N is greater than M. Also, in another embodiment when N is less than M, these measurements are operated on using the least square method to give the current values that produce the least error of the frequencies for all the cells, thus enabling homogeneous magnetic field to be applied to all the cells. In the foregoing manner, the invention provides a simple and reliable method for providing uniform and homogeneous magnetic field to all cells of a probe.

The foregoing description is illustrative of the principles of the invention. Numerous modifications and extensions thereof would be apparent to the worker skilled in the art. All such modifications are to be considered to be within the spirit and scope of the invention.

What is claimed is:

1. A method of optimizing effects of a shim on adjusting a magnetic field applied to a plurality of cells of a probe, said method comprising the steps of determining values of currents which are applied to a plurality of coils of said shim so that the resonant frequency of each cell of said probe is substantially the same and so that the plurality of cells of said probe are subjected to a uniform magnetic field.

2. The method of claim 1, wherein said values of currents are determined by the following steps:

measuring resonant frequency of each of said cells disposed in said magnetic field without any current being supplied to said plurality of coils of said shim, thereby to obtain $G_1, G_2 \ldots G_M$ wherein M is the number of cells;

measuring resonant frequency of a first cell of said probe using a current $I_1$ applied to a first shim coil and without any current being applied to the other shim coils, to obtain $F_{11}$ wherein the first subnumber represents the number of probe cell and the second subnumber represents the number of shim coil;

measuring resonant frequency of a second cell with current $I_1$ being applied to a first shim coil and without any current being applied to the other shim coils, to obtain $F_{21}$;

providing a matrix of factors $a_{jk}$ for resonant frequency of said cells of said probe using the following equation:

$$a_{jl} = \frac{F_{jl} - G_j}{I_1}$$

repeating the above measurements on each cell using a current $I_2$ applied to a second shim coil and without any current being applied to other shim coils to obtain $F_{j2}$ and using the above relationship to find $a_{j2}$, continuing this process through all the coils of said shim;

wherein said matrix becomes:

$$A = \begin{bmatrix} a_{11} & a_{12} & \ldots & a_{1N} \\ a_{21} & a_{22} & \ldots & a_{2N} \\ \vdots & \vdots & & \vdots \\ a_{M1} & a_{M2} & \ldots & a_{MN} \end{bmatrix}$$

finally using relationship F=G+AI, find the values of I that gives best fit to a desired resonant frequency of each cell of said probe.

3. The method of claim 2, wherein number of shim coils N is equal to or greater than the number of probe cells M.

4. The method of claim 2, wherein number of shim coils N is less than number of probe cells M, and wherein said matrix is subjected to a least square operation, and the least error is obtained for each cell for the current I being applied to said shim coils to adjust the magnetic field so that each probe cell has the same magnetic field.

5. The method of claim 1, wherein said magnetic field is applied by a magnet in an imaging apparatus, and said plurality of probe cells are disposed within said magnetic field, and said plurality of shim coils are disposed in said magnetic field close to said probe cells.

6. The method of claim 1, wherein said probe cells and said shim coils are provided in a liquid spectroscopy apparatus.

7. The method of claim 2, wherein number of shim coils N is equal to number of probe cells M, wherein currents I are determined using the following equation:

$$I = A^{-1}(F_0 - G)$$

wherein I is a matrix of currents which provides the same resonant frequency $F_0$ of all said probe cells, and G is resonant frequency of all said probe cells M without any current being supplied to said shim coils N.

8. A method of determining shim coil setting when number of probe cells is greater than number of shim coils, comprising the steps of finding currents required to any desired set of using a least square of errors of frequencies from a desired set of resonant frequencies.

* * * * *

UNITED STATES PATENT AND TRADEMARK OFFICE
CERTIFICATE OF CORRECTION

PATENT NO. : 6,794,868 B1
DATED : September 21, 2004
INVENTOR(S) : Wai Ha Wong and Weston A. Anderson It is certified that error appears in the above-identified patent and that said Letters Patent is hereby corrected as shown below:

<u>Column 8,</u>
Line 61, should read as follows:
-- A method of determining shim coil setting when number of probe cells is greater than number of shim coils, comprising the steps of:
    applying currents to said shim coils;
    measuring resonant frequencies from said probe cells, and
    optimizing the currents of said shim coils by using a least square of errors of frequencies from a desired set of resonant frequencies. --.

Signed and Sealed this

Thirtieth Day of May, 2006

JON W. DUDAS
*Director of the United States Patent and Trademark Office*